United States Patent [19]

Hoffarth et al.

[11] Patent Number: 4,868,350
[45] Date of Patent: Sep. 19, 1989

[54] HIGH PERFORMANCE CIRCUIT BOARDS

[75] Inventors: Joseph G. Hoffarth, Binghamton; John P. Wiley, Vestal, both of N.Y.

[73] Assignee: International Business Machines Corporation, Armonk, N.Y.

[21] Appl. No.: 165,011

[22] Filed: Mar. 7, 1988

[51] Int. Cl.$^4$ .......................... H05K 1/00; H05K 3/00
[52] U.S. Cl. ....................................... 174/68.5; 29/830
[58] Field of Search .......................... 174/68.5; 29/830

[56] References Cited

U.S. PATENT DOCUMENTS

| | | | |
|---|---|---|---|
| 3,972,755 | 8/1976 | Misfeldt | 174/68.5 X |
| 4,591,659 | 5/1986 | Leibowitz | 174/68.5 |
| 4,644,093 | 2/1987 | Yoshihara et al. | 174/36 |
| 4,661,301 | 4/1987 | Okada et al. | 156/228 X |
| 4,747,897 | 5/1988 | Johnson | 156/148 |
| 4,755,783 | 7/1988 | Fleischer et al. | 336/84 C |
| 4,755,911 | 7/1988 | Suzuki | 174/68.5 X |

Primary Examiner—Morris H. Nimmo
Attorney, Agent, or Firm—Pollock, Vande Sande & Priddy

[57] ABSTRACT

The invention features a method of fabricating a printed circuit board having improved circuit board performance. The circuit board utilizes low dielectric materials having dielectric constants of less than 3.0. The dielectric layers are spaced apart from plated through-holes, thus eliminating the interface between the metallized surface of the through-hole and the dielectric sheet. Thus, the low dielectric layer is not required to be plated.

The lower dielectric character of the laminates improves wiring density, circuit speed, and provides for thinner laminates and cores.

15 Claims, 1 Drawing Sheet

HIGH PERFORMANCE CIRCUIT BOARDS

FIELD OF THE INVENTION

The invention relates to printed circuit boards, and more particularly to a method of fabricating these laminated printed circuit composites to provide high perfomance.

BACKGROUND OF THE INVENTION

Generally speaking, high density printed circuit boards are constructed with several electrically conductive layers separated by dielectric layers. Some of the conductive layers are utilized to supply power and ground voltages. The remaining conductive layers are patterned for electrical signal interconnections among integrated circuit chips. Layer-to-layer interconnections are achieved by means of through-holes plated with electrically conductive material. In high density printed circuit boards it has been normal practice to provide interconnections between adjacent conducting layers, which interconnections are commonly known as "vias".

It has been the task of circuit board designers and scientists to achieve a balance between many competing and interdependent parameters in order to obtain optimum performance.

Many times parameter selection is limited or influenced by the available choice of materials and/or the processes by which these materials can be used. For example, signal lines will often pick up energy from adjacent lines, known as "signal cross-talk" or "coupled noise". Minimum spacing between adjacent lines is influenced by this signal cross-talk. A decrease in the dielectric constant (a material dependent parameter) of the dielectric sheet of the uncircuitized core is known to improve wiring density. However, as materials with lower dielectric constants are chosen, i.e., materials having a dielectric constant of 3.0 or less, it becomes increasingly difficult to process them into workable laminates. These materials are not easily bonded to surrounding or adjacent layers, nor are they easily adhered to plated through-holes.

Polytetrafluoroethylene is a prime example of a material which is difficult to laminte or adhere to other surfaces. Yet, this material has a dielectric constant of approximately 2.1, which makes it ideal as a material which would improve performance ad dimensional characteristics.

In U.S. Pat. No. 3,305,416; issued: Feb. 21, 1967, it is suggested that a dielectric sheet for use in circuit boards can comprise a polytetrafluoroethylene as one of many desirable materials. A conversion coating is necessary for placement on adjacent metal layers, before bonding to the dielectric layer can be achieved. No mention, however, is made therein of the particular difficulty in which polytetrafluoroethylene fails to adhere to the plated through-holes.

Despite twenty years of research since the issuance of this patent, no convenient or commercial means has been found to bond this low dielectric material to plated through-holes, and thus, the use of polytetrafluoroethylene for dielectric sheet has not been of practical consequence in circuit board construction.

SUMMARY OF THE INVENTION

The invention features a new method of constructing dielectric sheet laminates using dielectric materials having extremely low dielectric constants, such as polytetrafluoroethylene.

As dielectric materials are selected for circuit board construction having dielectric constants at or below 3.0, it becomes increasingly difficult to laminate or bond these materials to other circuit board surfaces. In particular, metallized or plated surfaces of through-holes and vias do not have enough dimensional clearance to allow for conversion coatings to be applied in order that these surfaces can be made bondable to these materials.

The subject invention has perfected a method of fabricating a dielectric layer of a laminated circuit board, which does not require bonding the dielectric material to plated through-hole or via surfaces.

For the purposes of brevity, the description shall hereinafter refer to through-holes and vias by the single term "through-hole".

The invention spaces the dielectric material of the dielectric layer apart from the through-holes, such that the necessity to bond to plated or metallized surfaces is eliminated by virtue of the fact that these surfaces do not interface with each other.

When the dielectric sheet is fabricated, perforations at all sites requiring through-holes are constructed with larger diameters than that of the through-holes. Then by applying proper registration between the dielectric sheet perforations and the through-holes of the other laminate layers, the circuit board can be assembled without any interfacing between the dielectric material and the through-holes.

Pursuant to this purpose, the exposed dielectric material surfaces are embedded by an encapsulant either before or during lamination of the dielectric sheet to the power plane or signal plane.

By so encapsulating the dielectric material, however, still other advantages are obtained by this method of construction. The encapsulant becomes the interfacing material which not only easily bonds to through-hole surfaces, but also lends itself to an improved laminating facility to adjacent layers. The encapsulants can be chosen of materials which themselves have lessened dielectric constants, such that the overall "dielectric character" of the assembly is improved.

Encapsulants that have a lower dielectric constant are generally those that are glass-free, such as an epoxy resin or one of several commercial bonding films, such as chlorotrifluoroethylene. "If desired, the encapsulant can be glass reinforced resin";

The advantages of the invention provide for the fabrication of printed circuit boards of high performance. Dimensional control is improved in manufacturing the circuit boards, whose laminating layers can now be made thinner.

Problems with cross-talk and signal reflection are reduced.

Line densities can be improved, with the further result that printed circuit boards having an impedance of approximately 35 to 120 ohms can be designed for different chip technologies with the preferred range being 50 to 80 ohms.

Other objects and advantages of this invention will become more apparent and will be better understood in view of the subsequent detailed description considered in conjunction with the accompanying drawings.

DETAILED DESCRIPTION OF THE INVENTION

In general, the printed circuit board of this invention is constructed using many of the same materials and processes outlined and described in U.S. Pat. No. 4,448,804, issued: May 15, 1984 to Amelio et al, which teaches a technique for plating copper to non-conductive surfaces, such as dielectric materials; U.S. Pat. No. 4,030,190, issued: June 21, 1977 to Varker, which describes a method of forming multilayered printed circuit boards; and U.S. Pat. No. 3,523,037, issued: Aug. 4, 1970 to Chellis, which illustrates a method of fabricating laminate boards that are used to construct multilayered assemblies.

For the sake of brevity, it is desired to incorporate herein, the teachings and description of these materials and processes from the aforementioned patents, all of which are hereby incorporated by reference. The obvious exceptions in the description are those teachings relating to the fabrication of the low dielectric uncircuitized core of the present invention.

The invention features a high density printed circuit board whose dielectric sheet is spaced apart from all electrically conductive surfaces, thus eliminating the bonding interface therebetween. As a consequence, low dielectric materials can be utilized in order to improve circuit board performance.

Figure 1:
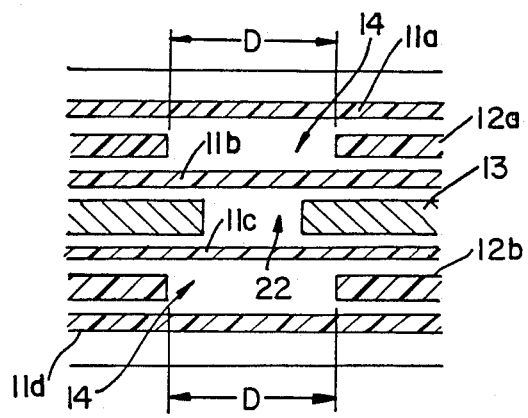
FIG. 1 illustrates a partial, exploded sectional view of the uncircuitized core of this invention prior to lamination.

Now referring to FIG. 1, the uncircuitized core of this invention is shown in an unlaminated, partial sectional view. The uncircuitized core comprises four layers of bonding resin, designated 11a, 11b, 11c and 11d.

Between bonding layers 11a and 11b; and layers 11c and 11d are respectively disposed sheets 12a and 12b of dielectric material.

Between bonding layers 11b and 11c is disposed a power plane, layer 13 containing hole 22.

For the sake of clarity like core elements will be represented by the same designation throughout the figures.

Dielectric sheets 12a and 12b are shown with typical perforations 14 of diameter "D". All perforations 14 (typical) are disposed in the dielectric sheets 12a and 12b, respectively, at all those sites requiring plated through-holes (see typical plated through-hole 15, shown in FIG. 4).

Figure 4:
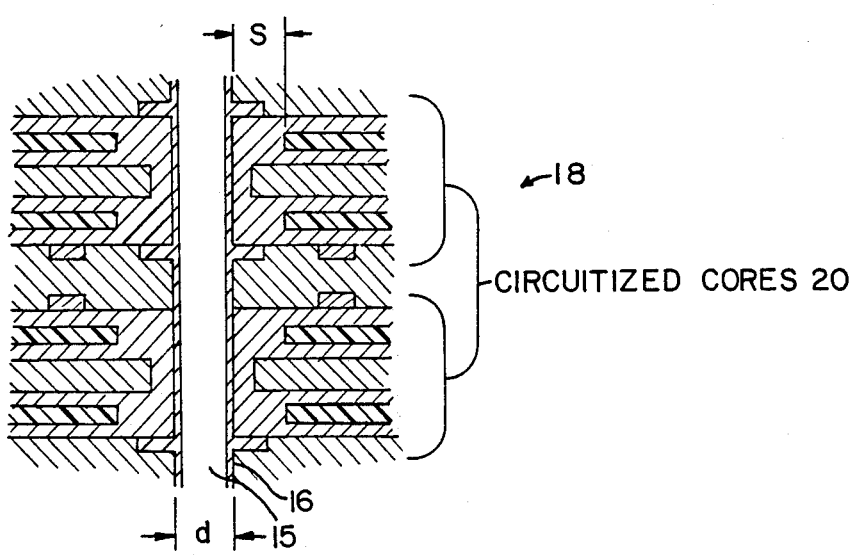
FIG. 4 shows an in situ, partial sectional view of a circuit board assembly incorporating two circuitized cores as depicted in FIG. 3.

The diameter "D" of the typical perforation 14 shown in FIG. 1 is approximately 1.3±0.05 mm across, and a range of application from 2.2 mm to 0.46 mm, compared to the smaller outer diameter "d" of typical plated through-hole 15, depicted in FIG. 4, which is approximately 0.46±0.02 mm across, and a range of application from 1.09 mm to 0.25 mm.

It is the intention of this invention that the dielectric sheets 12a and 12b wherever perforated with holes 14 are spaced apart from the plated outer surface 16 (FIG. 4) of a typical through-hole 15 by the distance "S", which is the distance between the through-hole 15 and the perforated dielectric material 12a and 1b. It is given by $S = (D-d)/2$.

By spacing the dielectric sheets 12a and 12b from plated outer surface 16 of through-hole 15, the dielectric material of sheets 12a and 12b can be selected to have an extremely low dielectric constant of less than 3.0; and preferably in the range from 1.4 to 3.0.

Polytetrafluoroethylene, a preferred material, has a dielectric constant of about 2.1.

Dielectric materials with such low dielectric constants are generally chemically inert, and will not easily bond to metal or metallized surfaces, such as those of plated through-hole 15.

Therefore, when dielectric sheets 12a and 12b are spaced apart from metallized surface 16, the interface between these incompatible materials does not exist, and thus, the need to bond the dielectric material to a metal or metallized surface is eliminated.

Figure 2:
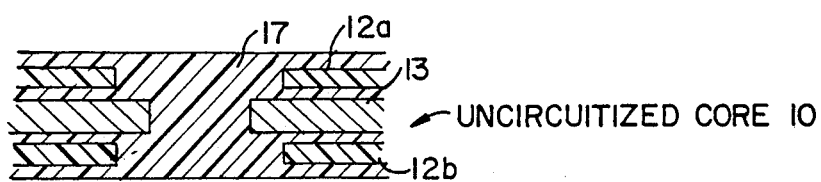
FIG. 2 depicts a partial sectional view of the uncircuitized core shown in FIG. 1, after lamination.

The composite core structure shown in FIG. 2 results when the layers 11a, 11b, 11c and 11d are laminated together. Dielectric sheets 12a, 12b and layer 13 become embedded within what becomes the integral encapsulant 17. It is necessary to register perforation 14 with hole 22 before lamination.

By choosing encapsulant layers 11a–11d from materials that are glass-free, such as epoxy, or any one of several commercially available bonding films, such as chlorotrifluoroethylene, it becomes possible to reduce still further, the overall dielectric character of the uncircuitized core 10.. The reduction of the dielectric character allows for the overall reduction in the thickness of the layers. These layers now being thinner, the dimensional control of the fabricating process is improved.

Figure 3:
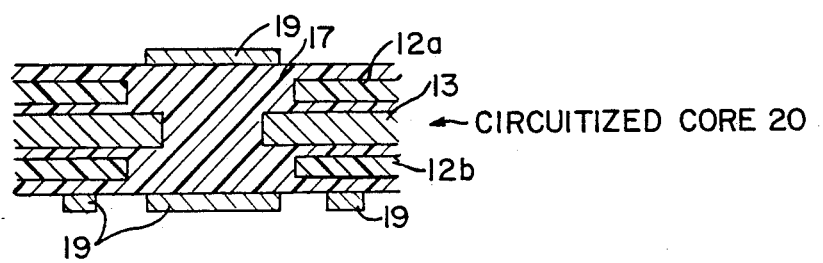
FIG. 3 illustrates a partial sectional view of the core shown in FIG. 2 after it is circuitized.

Next, the laminated uncircuitized core 10, FIG. 2 is circuitized to form circuitized core 20, as illustrated in FIG. 3, utilizing techniques shown in aforementioned U.S. Pat. No. 4,448,804. The signal lines 19 to be formed, are achieved by the lamination of a copper sheet (not shown) to surfaces of encapsulant 17, which copper sheet is then etched away and subsequently circuitized in the manner described to form the signal lines.

After the circuitized core 20 is fabricated, it is laminated to a similar circuitized core 20, as shown in FIG. 4. Again the use of epoxy resin or chlorotrifluoroethylene is useful in laminating the circuitized cores 20 together in forming the completed circuit board assembly 18, FIG. 4. The signal lines 19 will be electrically more isolated as a result of the inventive construction shown herein, with the consequence that cross-talk will be reduced, and signal propagation speed will be increased.

FIG. 4 depicts a typical construction utilizing the circuitized cores 20 of this invention. A typical through-hole is drilled in the assembly 18, and each core 20 is respectively plated to form a plated through-hole 15.

The foregoing description describes the best mode of construction of the invention, and is meant to convey only an exemplary understanding of the method of fabrication. In no way is the invention meant to be limited by any specific detail, or to exclude any modification that would be obvious within the scope of the inventive intent.

Having thus described the invention, what is desired to be protected by Letters Patent is presented in the subsequently appended claims.

What is claimed is:

1. A laminated circuit board comprising at least one sheet of dielectric material having a dielectric constant of approximately less than 3.0 and containing perforations; a layer containing electrically conductive surfaces and plated through-holes; wherein said dielectric material is encapsulated within a resin and is operatively spaced apart from said electrically conductive surfaces and plated through-holes and wherein perforations in said dielectric material are in registry with plated through-holes of said layer and are greater in diameter than said through-holes.

2. The laminated circuit board of claim 1, wherein said dielectric material has a dielectric constant in an approximate range from 1.4 to 3.0.

3. The laminated circuit board of claim 2, wherein said dielectric material comprises polytetrafluoroethylene.

4. The laminated circuit board of claim 1 having an impedance in a range from approximately 35 to 120 ohms.

5. The laminated circuit board of claim 1, wherein said sheet of dielectric material is encapsulated in an epoxy resin.

6. The laminated circuit board of claim 1, wherein said sheet of dielectric material is encapsulated in a glass reinforced resin.

7. A method of fabricating a laminated circuit board utilizing low dielectric materials as a means to improve circuit board performance and achieve improved dimensional control, comprising the steps of:
   (a) fabricating at least one dielectric layer of said laminated circuit board with dielectric material having a dielectric constant of approximately less than 3.0 and containing perforations;
   (b) encapsulating said at least one dielectric layer within a resin to provide an encapsulated sheet;
   (c) providing a layer containing electrically conductive surfaces and plated through-holes on said encapsulated dielectric layer wherein said at least one encapsulated dielectric layer is operatively spaced apart from said electrically conductive surfaces and said plated through-holes by said encapsulating and wherein perforations in said encapsulated material are in registry with plated through-holes of said layer and are greater in diameter than said through-holes.

8. The method of claim 7 wherein said layer is an electrically conductive plane.

9. The method of claim 7, wherein said dielectric material has a dielectric constant in an approximate range rom 1.4 to 3.0.

10. The method of claim 9, wherein said dielectric material comprises polytetrafluoroethylene.

11. A method of fabricating a laminated circuit board utilizing low dielectric materials as a means to improve circuit board performance and achieve improved dimensional control, comprising the steps of:
   (a) providing a dielectric sheet of said laminated circuit board with perforations;
   (b) encapsulating said dielectric sheet within a resin to provide an encapsulated dielectric sheet;
   (c) laminating the encapsulated dielectric sheet to an electrically conductive plane having through holes, wherein said encapsulated dielectric sheet is operatively spaced apart from said electrically conductive plane and through-holes by said encapsulating and wherein perforations in said encapsulated dielectric sheet are in registry with through-holes of said plane and are greater in diameter than said through-holes; and
   (d) assembling a laminated circuit board utilizing the encapsulated dielectric laminate.

12. The method of claim 11, further comprising the steps of:
   (e) plating said through-holes of said laminated circuit board.

13. The method of claim 11, wherein said dielectric sheet comprises dielectric material having a dielectric constant of approximately less than 3.0.

14. The method of claim 13, wherein said dielectric sheet comprises dielectric material having a dielectric constant in an approximate range from 1.4 to 3.0.

15. The method of claim 14, wherein said dielectric sheet comprises polytetrafluoroethylene.

* * * * *